United States Patent
Zhang

(10) Patent No.: US 10,393,789 B2
(45) Date of Patent: Aug. 27, 2019

(54) GROUND FAULT TESTER

(71) Applicant: Siemens Industry, Inc., Alpharetta, GA (US)

(72) Inventor: Jingwang Zhang, Yorba Linda, CA (US)

(73) Assignee: SIEMENS MOBILITY, INC., New York, NY (US)

( * ) Notice: Subject to any disclaimer, the term of this patent is extended or adjusted under 35 U.S.C. 154(b) by 439 days.

(21) Appl. No.: 15/343,518

(22) Filed: Nov. 4, 2016

(65) Prior Publication Data

US 2018/0128867 A1    May 10, 2018

(51) Int. Cl.
    *G01R 31/02*    (2006.01)
    *G01R 31/327*    (2006.01)
    *H02H 3/33*    (2006.01)

(52) U.S. Cl.
    CPC ........ *G01R 31/025* (2013.01); *G01R 31/3274* (2013.01); *G01R 31/3275* (2013.01); *H02H 3/335* (2013.01)

(58) Field of Classification Search
None
See application file for complete search history.

(56) References Cited

U.S. PATENT DOCUMENTS

| | | | | |
|---|---|---|---|---|
| 8,040,139 | B2* | 10/2011 | Plagens | B60L 3/0023 324/509 |
| 2003/0169051 | A1* | 9/2003 | Tallman | G01R 31/025 324/523 |
| 2004/0174173 | A1* | 9/2004 | Elms | G01R 31/024 324/509 |

\* cited by examiner

*Primary Examiner* — Aditya S Bhat

(57) ABSTRACT

A ground fault tester (GFT) for monitoring ground fault of DC/Battery Powered Equipment is provided. The ground fault tester (GFT) comprises a signal conditioning unit to receive a raw signal (Vs) for monitoring a ground fault and output a voltage signal (Vr), an adjustable threshold module (TH) to provide a threshold voltage (Vth) and a comparator to compare two voltages (Vr), (Vth) and output a signal indicative of the ground fault. The ground fault tester (GFT) further comprises a controller to receive a test request command and output a GFT output. The controller to control a relay device (K) for flowing a calculated test current (Itest) to a ground (GND). The controller to receive the signal indicative of the ground fault and control the adjustable threshold module (TH) to selectively vary the threshold voltage (Vth) in order to verify whether the signal conditioning unit is functional or not based on a delta output from the signal conditioning unit being proportional or not to a delta stimulus, introduced by engaging a known test resistance (Rt1) and (Rt2) in parallel with an existing ground leak resistance, to the signal conditioning unit.

13 Claims, 4 Drawing Sheets

GROUND FAULT TESTER

BACKGROUND

1. Field

Aspects of the present invention generally relate to ground fault testers (GFTs) and more specifically relate to a ground fault tester (GFT) that could verify the integrity of its self test circuit to accurately detect a ground fault and correctly report that a unit is in good health or not.

2. Description of the Related Art

A ground fault circuit breaker is an electrical protection device that disconnects a circuit when current leakage is detected. Leakage occurs when current flowing through a line, or "hot," conductor from a source to a load is diverted to ground without returning to the source. This leakage may result from an accidental short circuit, perhaps from a defective load attached to the line. If a person touches the load, the leakage current may pass that person's body to ground, leading to an electrical shock. Consequently, ground fault circuit interrupters ("GFCIs") act as safety devices and are designed to detect line-to-ground shorts and to disconnect the distribution circuit. The GFCI is commonly used in AC power application in stand-alone mode without a built-in automated self test, and users are advised to engage a test switch to verify the health of GFCI function.

The railroad signalling equipment traditionally powered by a battery or DC, called DC Powered Equipment "DPE" requires the system circuit operates in a floating scheme reference to earth ground. A leakage between DC Powered system and the earth ground could lead the system to an unsafe or undesired operation. A Ground Fault Detector or Ground Fault Tester is the equipment that could alert the system when the ground fault condition exists.

The Ground Fault Tester (GFT) used in railway DC power application can either operate in stand-alone mode with requirement of scheduled manually on-site verification, or in modern era, railway users integrate this test into monitoring equipments (such as Safetran Event Analyzer Recorder (SEAR II) from Siemens) which can not only monitor and record the ground fault detection result from GFT, but also periodically command GFT to perform self test to verify the health of GFT itself. Such GFT operates in two modes: monitoring mode and self test mode.

A known ground fault tester has a self test circuit to verify a ground fault detection threshold, but the internal failure and or existing leakage in the system could lead to a situation that the ground fault detection threshold could not be verified. The failure combined with existing system level leakage could lead a ground fault tester (GFT) declaring itself as healthy device event the unit fails.

In a Ground Fault Tester (GFT), an oscillator OSC generates low frequency sinusoidal AC signal reference to earth ground and fed into an amplifier (AD1) to create a low impedance AC source (Vd). The AC source (Vd) is fed into a nodal supposition circuit through a resistor Rd. A connection of the nodal supposition circuit is switched to earth ground through a relay device controlled by a controller (U1). A signal (Vs) is the raw signal for monitoring a ground fault, sampled from the connection between Rd and nodal supposition circuit. The signal (Vs) is further filtered by amplifier-filter (AF1), which provides signal conditioning, frequency filtering to remove out of band noise, amplitude adjustment and buffer. The output of (AF1) is the signal (Vr). The signal (Vr) is compared with a fixed threshold and the result is a binary signal indicating a ground fault occurred or not.

When there is no ground fault at the system level, an external ground fault leakage current $I_{leak}$ is zero, the signal Vs is full scale of signal Vd. When there is ground fault leaks, equivalent a resistance from both of battery terminal and earth ground, the signal Vs will decrease, so does the signal Vr. The GFT will alarm the ground fault when the signal Vr goes below the fixed preset threshold.

$$Vr = G_{AF1} * Vs$$

$$Vs = Vd - (Rd * (I_{leak} + I_{test}))$$

while $G_{AF1}$ is transfunction gain of AF1.

By monitoring the signal (Vs), and comparing it to a preset threshold, the GFT is able to detect the ground fault between DPE and earth ground. During monitoring mode, the GFT will alarm the ground fault when the signal Vr goes below the fixed preset threshold. In test mode, to verify the GFT is functional and capable to monitoring a ground fault, by command by external device, the relay contacts are switched to short, resistors simulate a ground fault leak from DPE to earth. If the ground fault detected, the controller (U1) or external equipment, which commands the test, would verify the GFT is in good health and functional. The periodical test is an important procedure for application to ensure the system is indeed monitored under a functional ground fault detection device.

While the component (AF1) is necessary for conditioning the monitoring signal (Vs), there is a combination failure mode that could lead to a situation that the integrity of (AF1) is not verifiable. During a self test, if there is existing ground leakage through DPE that occurs, it combines with a failure inside the (AF1) which may increase the amplitude output of signal (Vr), and translate the gain of (AF1) to increase. When the actual leakage current is higher than a trigger threshold, but due to the failure in (AF1), it goes under the trigger threshold (Vr>Vth) and the ground fault is not detected. However, in the test mode, the combined leakage current (existing system leak current $I_{leak}$ and test leakage current $I_{test}$) is greater than the trigger threshold, the extra introduced current $I_{test}$ consequently cause Vr to go beyond the preset threshold (Vr<Vth), and the unit should detect the ground fault in the test mode and declare the unit healthy. In this case the GFT fails to detect the ground fault and rather reports that the unit is in good health.

Therefore, there is a need for improvements in a ground fault tester (GFT) that could verify the integrity of its self test circuit to accurately detect a ground fault and correctly report that a unit is in good health or not.

SUMMARY

Briefly described, aspects of the present invention relate to verifying a ground fault tester (GFT) is in good health and functional. A periodical test ensures a DPE unit being monitored is indeed monitored by a functional ground fault detection device. In particular, a ground fault tester (GFT) is provided that could verify the integrity of its self test circuit to accurately detect a ground fault and correctly report that it is in good health or not. One of ordinary skill in the art appreciates that such a ground fault tester (GFT) can be configured to be installed with a battery powered equipment (e.g., Railway signalling system, such as Grade Crossing Prediction (GCP4000) system from Siemens) and a Safetran Event Analyzer and Recorder II (SEAR II) device from Siemens or with any 3rd party equipment that can be configured to accept binary ground fault detection result and could command a self-test request to the GFT. The Safetran Event Analyzer and Recorder II (SEAR II) is a system for monitoring and reporting equipment operation at railroad grade crossing, interlocking and wayside signal installations.

In accordance with one illustrative embodiment of the present invention, a ground fault tester (GFT) for an Event Analyzer and Recorder is provided. The ground fault tester (GFT) comprises an AC source (Vd) configured to feed into a nodal supposition circuit through a resistor (Rd), the nodal supposition circuit switched to a ground (GND) through a relay device (K). A DC/battery powered equipment (DPE) being monitored for a ground fault by the ground fault tester (GFT) is coupled to the nodal supposition circuit, a virtual resistor (Ri) that represents a ground leak resistance for flowing a leakage current (Ileak) to the ground (GND). The ground fault tester (GFT) further comprises a signal conditioning unit having a linear gain coupled to the resistor (Rd) and the nodal supposition circuit to receive a raw signal (Vs) for monitoring a ground fault and output a voltage signal (Vr), an adjustable threshold module (TH) to provide a threshold voltage (Vth) and a comparator to compare two voltages the voltage signal (Vr) and the threshold voltage (Vth) and output a signal indicative of the ground fault. The ground fault tester (GFT) further comprises a controller to receive a test request command and output a GFT output. The controller to control the relay device (K) for flowing a test current (Itest) to the ground (GND) from the nodal supposition circuit. The controller to receive the signal indicative of the ground fault and control the adjustable threshold module (TH) to selectively vary the threshold voltage (Vth) in order to verify whether the signal conditioning unit is functional or not based on a disappearance of an alarm signal when a delta output from the signal conditioning unit is proportional or not to a delta stimulus, introduced by engaging a known test resistance (Rt1) and (Rt2) in parallel with an existing ground leak resistance, to the signal conditioning unit responsive to the test request command.

In accordance with another illustrative embodiment of the present invention, a test circuit of a ground fault tester (GFT) for use with an Event Analyzer and Recorder is provided. The test circuit comprises a signal conditioning unit configured to receive a raw signal (Vs) for monitoring a ground fault and output a voltage signal (Vr), a comparator configured to receive the voltage signal (Vr) and a threshold voltage (Vth) from an adjustable threshold module (TH), and a controller configured to control a test current (Itest). The comparator to compare two voltages (Vr), (Vth) and output a signal indicative of the ground fault. The adjustable threshold module (TH) instead of a fixed threshold gives end users the ability to select different level of ground fault current leakage detection tailored to the system requirement. The controller to receive the signal indicative of the ground fault and control the adjustable threshold module (TH) to selectively vary the threshold voltage (Vth) in order to verify whether the signal conditioning unit is functional or not based on a delta output from the signal conditioning unit being proportional or not to a delta stimulus, introduced by engaging a known test resistance (Rt1) and (Rt2) in parallel with an existing ground leak resistance, to the signal conditioning unit responsive to a test request command.

In accordance with yet another illustrative embodiment of the present invention, a method of self-testing a ground fault tester (GFT). The method comprising: providing a signal conditioning unit configured to receive a raw signal (Vs) for monitoring a ground fault and output a voltage signal (Vr), the ground fault tester (GFT) including a relay device (K), wherein an AC source (Vd) is configured to feed into the nodal supposition circuit through a resistor (Rd), the nodal supposition circuit switched to a ground (GND) through the relay device (K), wherein a DC/battery powered equipment (DPE) is monitored for a ground fault by the ground fault tester (GFT) is coupled to the nodal supposition circuit and a virtual resistor (Ri) that represents a ground leak resistance for flowing a leakage current (Ileak) to the ground (GND), providing a comparator configured to receive the voltage signal (Vr) and a threshold voltage (Vth) from an adjustable threshold module (TH), comparing by the comparator two voltages (Vr), (Vth) and outputting a signal indicative of the ground fault, providing a controller configured to control a test current (Itest), wherein the controller to receive the signal indicative of the ground fault, in response to a test request command, controlling the adjustable threshold module (TH) to selectively vary the threshold voltage (Vth) and verifying whether the signal conditioning unit is functional or not based on a delta output from the signal conditioning unit being proportional or not to a delta stimulus, introduced by engaging a known test resistance (Rt1) and (Rt2) in parallel with an existing ground leak resistance, to the signal conditioning unit.

DETAILED DESCRIPTION

To facilitate an understanding of embodiments, principles, and features of the present invention, they are explained hereinafter with reference to implementation in illustrative embodiments. In particular, they are described in the context of being a ground fault tester (GFT) having a self test circuit that is configured for use with an Event Analyzer and Recorder. For example, such a self test circuit includes an adjustable threshold module for verifying whether the ground fault tester (GFT) is in good health and functional. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
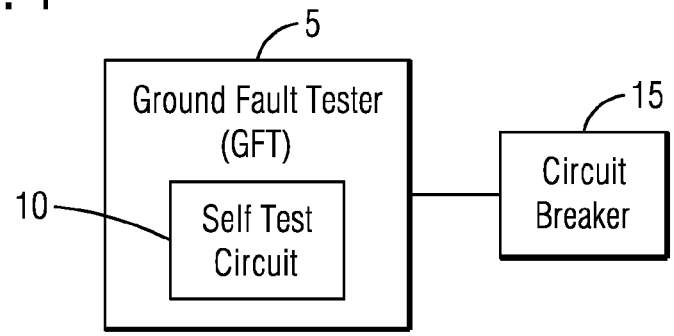
FIG. 1 illustrates a schematic of a ground fault tester (GFT) having a self test circuit that is configured for use with a battery powered equipment being monitored for ground fault (eg. Railway signalling system, such as Grade Crossing Prediction (GCP4000) system from Siemens) and a SEAR II in accordance with an exemplary embodiment of the present invention.

Consistent with one embodiment of the present invention, FIG. 1 represents a schematic of a ground fault tester (GFT) 5 having a self test circuit 10 that is configured for use with an Event Analyzer and Recorder 15 in accordance with an exemplary embodiment of the present invention. The ground fault tester (GFT) 5 has the self test circuit 10 that verifies a ground fault detection threshold even in view of an internal failure and or existing leakage in the Event Analyzer and Recorder 15 which otherwise could lead to a situation that the ground fault detection threshold could have not been verified. A ground fault detection threshold is a trigger threshold value of a current that can be configured in the self test circuit 10 to trigger ground fault detection at different levels of a ground leakage current.

For example, when the actual leakage current is higher than the trigger threshold value, but due to the failure in the self test circuit 10, it goes under the trigger threshold value then the ground fault is not detected. However, in a test mode, if the combined leakage current (an existing system leak current $I_{leak}$ and a test leakage current $I_{test}$) is greater than the trigger threshold value, the ground fault tester (GFT) 5 will detect the ground fault. In this way, an internal failure combined with an existing system level leakage would lead the ground fault tester (GFT) 5 declaring itself as healthy device even if the unit fails. The ground fault tester (GFT) 5 implements a test method to measure an existing ground leakage current and a test current by engaging the self test circuit 10. A delta current is introduced and further processed to be used to verify the functionality of the ground fault detection threshold.

The ground fault tester (GFT) 5 may monitor a DC/Battery powered equipment (DPE) 20 for a ground fault. The DPE 20 may include a DC battery 25 coupled to in parallel to a Railway Signalling System 30. The ground fault tester (GFT) 5 may be coupled to the Event Analyzer and Recorder 15. The Event Analyzer and Recorder 15 may be a system for monitoring and reporting equipment operation at railroad grade crossing, interlocking and wayside signal installations. During the monitoring mode, the Event Analyzer and Recorder 15 reads and records the ground fault indication 40 result from the ground fault tester (GFT) 5. During the test mode, the Event Analyzer and Recorder 15 may issue a test request 35 to the ground fault tester (GFT) 5. The ground fault tester (GFT) 5 by using the self test circuit 10 may provide a ground fault indication 40 to the Event Analyzer and Recorder 15.

Figure 2:
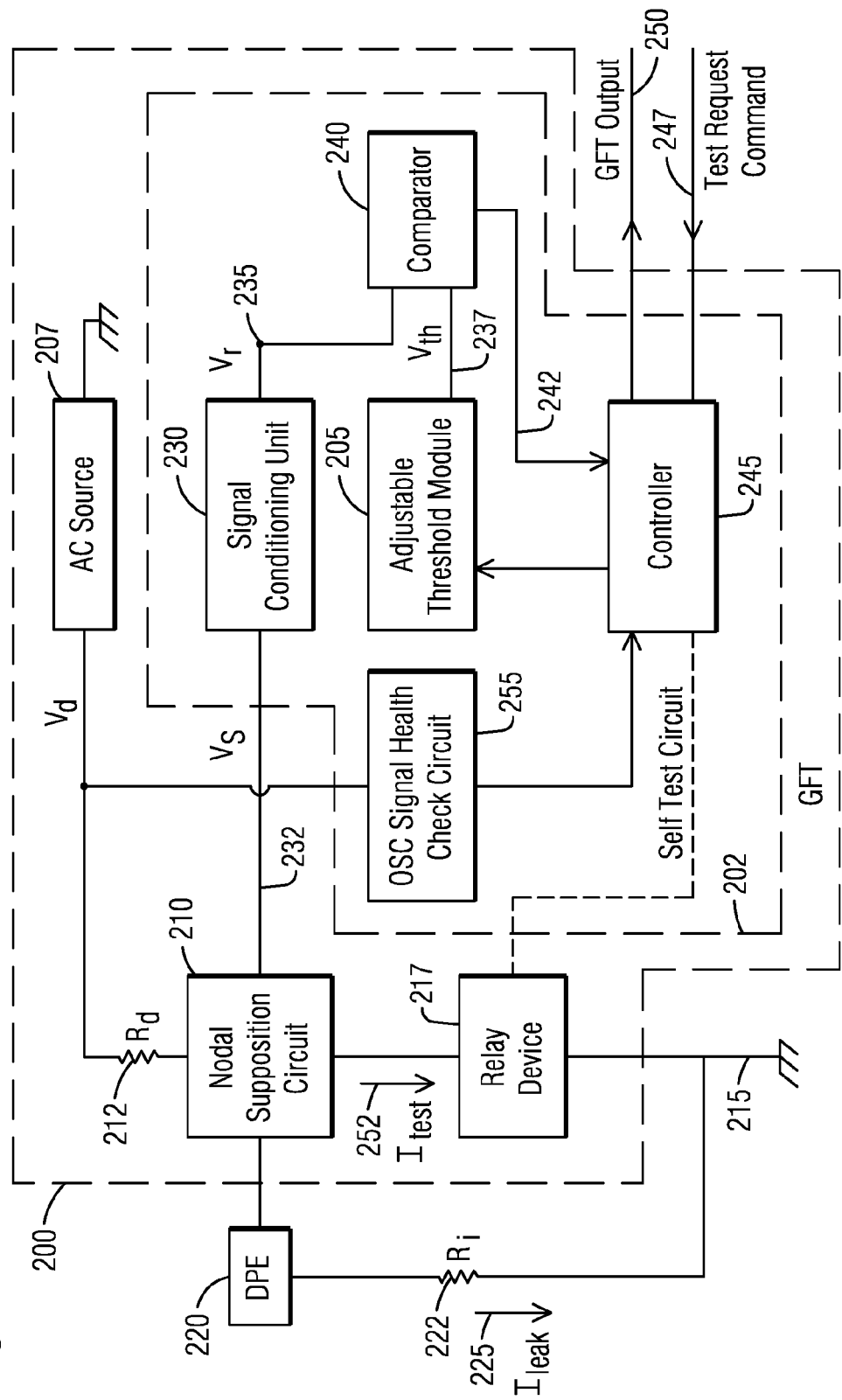
FIG. 2 illustrates a schematic block diagram of a ground fault tester (GFT) having a self test circuit including an adjustable threshold module in accordance with an exemplary embodiment of the present invention.

Referring to FIG. 2, it illustrates a schematic block diagram of a ground fault tester (GFT) 200 having a self test circuit 202 including an adjustable threshold module (TH) 205 in accordance with an exemplary embodiment of the present invention. The adjustable threshold module (TH) 205 to provide a threshold voltage. The purpose of the adjustable threshold module (TH) 205 is to introduce a configurable threshold module TH instead of a fixed threshold module. The benefit of the adjustable threshold module (TH) 205 is to offer a customer a module that can be configured to trigger at different levels of a ground leakage current. The adjustable threshold not only gives end users the ability to select different levels of ground fault current leakage detection tailored to the system requirement, but it is also used as a key validation tool in the present invention to verify the health of the signal conditioning unit AF1. All the components inside the illustrated ground fault tester (GFT) 200 are major elements for the purpose of discussion. An actual product however requires more circuit to become a functional product, such as an isolated power supply, surge protection, ESD protection, LEDs, connectors, enclosure etc.

The ground fault tester (GFT) 200 comprises an AC source (Vd) 207 configured to feed into a nodal supposition circuit 210 through a resistor (Rd) 212. The nodal supposition circuit 210 is switched to a ground (GND) 215 through a relay device (K) 217. The ground fault tester (GFT) 200 monitors a DC/battery powered equipment (DPE) 220 for a ground fault and is coupled to the nodal supposition circuit 210 and a virtual resistor (Ri) 222 that represents a ground leak resistance for flowing a leakage current (Ileak) 225 to the ground (GND) 215.

The self test circuit 202 comprises a signal conditioning unit 230 having a linear gain coupled to the resistor (Rd) 212 and the nodal supposition circuit 210 to receive a raw signal (Vs) 232 for monitoring a ground fault and output a voltage signal (Vr) 235. The signal (Vs) 232 is the raw signal for monitoring ground fault, sampled from the connection between (Rd) 212 and the nodal supposition circuit 210. The signal (Vs) 232 is further filtered by the signal conditioning unit 230, which provides signal conditioning, frequency filtering to remove out of band noise, amplitude adjustment and buffer. The output of the signal conditioning unit 230 is the signal (Vr) 235. The signal conditioning unit 230 may be a combination of a linear amplifier to provide a linear gain and a frequency filter to remove out of band noise.

The self test circuit 202 further comprises the adjustable threshold module (TH) 205 to provide a threshold voltage (Vth) 237. The self test circuit 202 further comprises a comparator 240 to receive the voltage signal (Vr) 235 and the threshold voltage (Vth) 237 to compare two voltages (Vr), (Vth) and output a signal 242 indicative of the ground fault. The voltage signal (Vr) 207 of the self test circuit 202 is compared by the comparator 240 with an adjustable threshold value of the adjustable threshold module (TH) 205 with the result being a binary signal indicating whether a ground fault occurs or not.

The self test circuit 202 further comprises a controller 245 to receive a test request command 247 and output a GFT output 250. The controller 245 to control the relay device (K) 217 for flowing a test current (Itest) 252 to the ground (GND) 215 from the nodal supposition circuit 210.

The controller 245 to receive the signal 242 indicative of the ground fault and control the adjustable threshold module (TH) 205 to selectively vary the threshold voltage (Vth) 237 in order to verify whether the signal conditioning unit 230 is functional or not based on a disappearance of an alarm signal when a delta output from the signal conditioning unit 230 is proportional or not to a delta stimulus, introduced by engaging a known test resistance (Rt1) and (Rt2) inside the nodal supposition circuit 210 in parallel with an existing ground leak resistance, to the signal conditioning unit 230 responsive to the test request command 247. The AC source (Vd) 207 comprises an oscillator (OSC) and having an output coupled to an OSC signal health check circuit 255 and the output of OSC signal health check circuit 255 is coupled to the controller 245 to provide a health check signal for an oscillator (OSC).

The overall impedance between the ground GND 215 and the connection node which connects Rd 212 and the nodal supposition circuit 210 is defined as overall leak path impedance Zb. When the test resistors (Rt1) and (Rt2) of the nodal supposition circuit 210 disengaged, and the DPE 220 has existing leak resistance Rb_a1, the overall leak path impedance is Zb_a1. The overall leak path impedance is changed to Zb_t when the test resistors (Rt1) and (Rt2) of the nodal supposition circuit 210 engaged.

In operation, the controller 245 checks whether an equation Vth_t=GAF1*Vd*|Zb_t/(Zb_t+Rd)| is TRUE or NOT to determine whether a failure occurred inside the signal conditioning unit 230. The term GAF1 is a gain of the signal conditioning unit 230. While the ground fault tester (GFT) 200 is commanded to conduct a test, the controller 245 first keeps the test resistors (Rt1) and (Rt2) of the nodal supposition circuit 210 disengaged. The controller 245 changes the output of the adjustable threshold module (TH) 205 until a trigger event is found. The controller 245 records this threshold as Vth_a1. The controller 245 uses this reading Vth_a1 to calculate the equivalent existing leak resistance Rb_a1 or Zb_a1, also calculate new overall leak path impedance Zb_t when the test resistors (Rt1) and (Rt2) are paralleled with Rb_a1. Then the controller 245 engages the test resistors (Rt1) and (Rt2), and continues to change the output of the adjustable threshold module (TH) 205 until a trigger drops to a no ground fault detected status, and records this threshold as Vth_t.

The equation Vth_t=GAF1*Vd*|Zb_t/(Zb_t+Rd)| is followed when the signal conditioning unit 230 is functional. If the equation Vth_t=GAF1*Vd*|Zb_t/(Zb_t+Rd)| is not maintained a failure occurred inside the signal conditioning unit 230 and the ground fault tester (GFT) 200 is declared un-healthy.

A recorded threshold value Vth_a is provided as a parameter to an end customer for estimating an existing ground fault leakage. During a normal operating condition with no testing is commanded, the controller 245 is configured to periodically change an output of the adjustable threshold module (TH) 205 until a trigger event is found if there is a existing system ground leakage through the DC/battery powered equipment (DPE) 220 or reach a threshold setting Vth_0 if there is no existing system ground leakage. The controller 245 records this threshold value as the recorded threshold value Vth_a. If the Vth_a is approaching a trigger point, the Vth_a serves as a warning alarm signal to an end user to diagnose a ground fault leakage before an actual ground fault reaches the trigger point.

Figure 3:
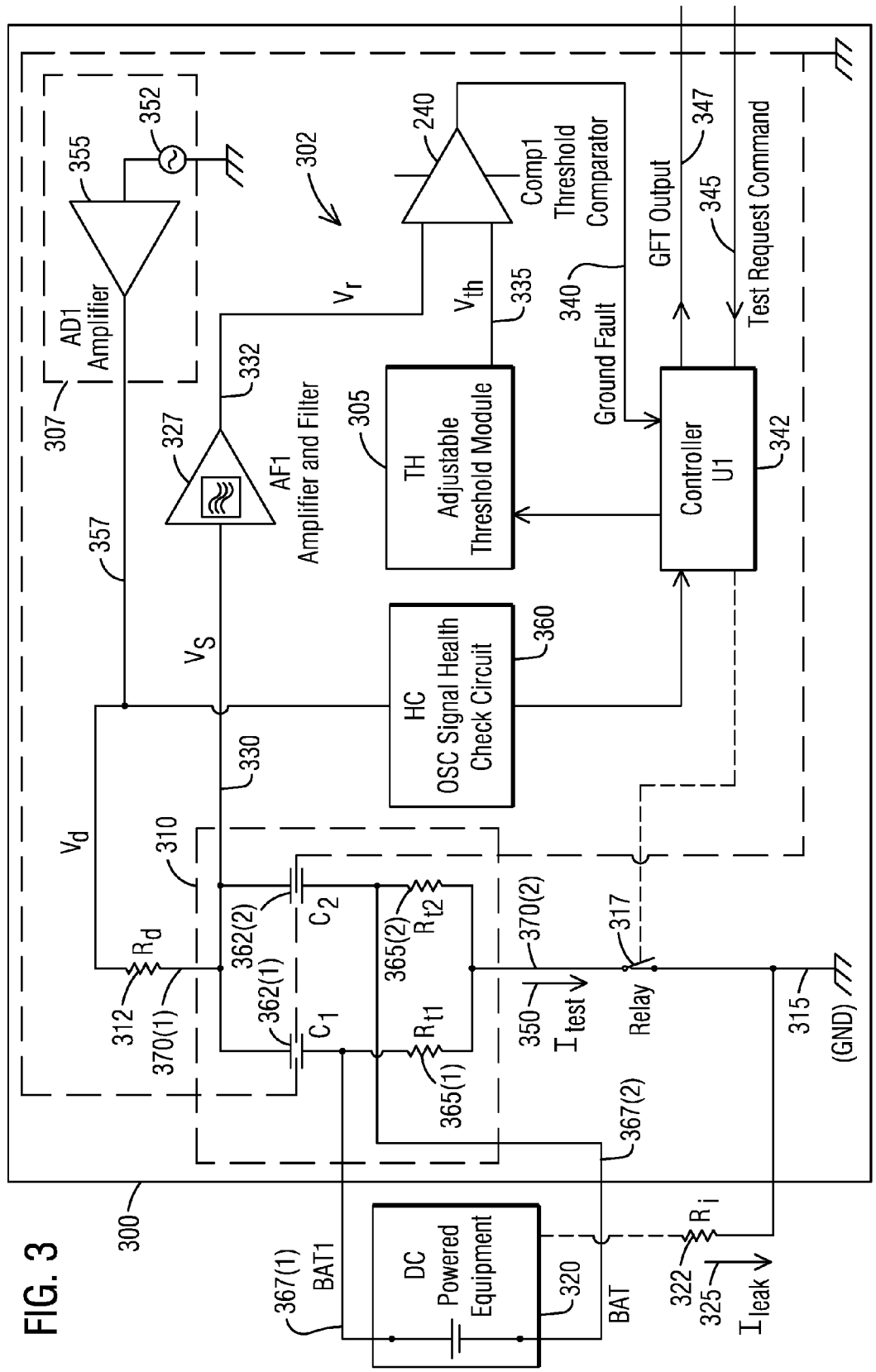
FIG. 3 illustrates a schematic block diagram of a ground fault tester (GFT) having a self test circuit including an adjustable threshold module in accordance with another exemplary embodiment of the present invention.

Turning now to FIG. 3, it illustrates a schematic block diagram of a ground fault tester (GFT) 300 having a self test circuit 302 including an adjustable threshold module (TH) 305 in accordance with another exemplary embodiment of the present invention. The ground fault tester (GFT) 300 comprises an AC source (Vd) 307 configured to feed into a nodal supposition circuit 310 through a resistor (Rd) 312. The nodal supposition circuit 310 is switched to a ground (GND) 315 through a relay device (K) 317. The ground fault tester (GFT) 300 monitors a DC/battery powered equipment (DPE) 320 for a ground fault and the DPE 320 is coupled to the nodal supposition circuit 310 and a virtual resistor (Ri) 322 that represents a ground leak resistance for flowing a leakage current (Ileak) 325 to the ground (GND) 315.

The ground fault tester (GFT) 300 further comprises a signal conditioning unit (AF1) 327 having a linear gain coupled to the resistor (Rd) 312 and the nodal supposition circuit 310 to receive a raw signal (Vs) 330 for monitoring a ground fault and output a voltage signal (Vr) 332. The ground fault tester (GFT) 300 further comprises the adjustable threshold module (TH) 305 to provide a threshold voltage (Vth) 335. The ground fault tester (GFT) 300 further comprises a comparator 337 to receive the voltage signal (Vr) 332 and the threshold voltage (Vth) 335 to compare two voltages (Vr), (Vth) and output a signal 341 indicative of the ground fault.

The ground fault tester (GFT) 300 further comprises a controller (U1) 342 to configure the threshold voltage (Vth) 335 to be set with the value which end user choose per system requirement during monitoring mode. The controller (U1) 342 monitors the signal 341 from comparator 337 and output a GFT output 347 to indicate if the system detected a ground fault or not. The controller (U1) 342 outputs the ground fault indication when the signal (Vr) 332 is below the threshold voltage (Vth) 335, and outputs no ground fault indication when the signal (Vr) 332 is above the threshold voltage (Vth) 335.

In the ground fault tester (GFT) 300 the controller (U1) 342 to receive a test request command 345 and output the GFT output 347 in the test mode. The controller (U1) 342 to control the relay device (K) 317 for flowing a test current (Itest) 350 to the ground (GND) 315 from the nodal supposition circuit 310. The controller (U1) 342 is configured to receive the signal 341 indicative of the ground fault and control the adjustable threshold module (TH) 305 to selectively vary the threshold voltage (Vth) 335 in order to verify whether the signal conditioning unit 327 is functional or not based on a disappearance of an alarm signal when a delta output from the signal conditioning unit 327 is proportional or not to a delta stimulus, introduced by engaging a known test resistance (Rt1) 365(1) and (Rt2) 365(1) in parallel with an existing ground leak resistance, to the signal conditioning unit to the signal conditioning unit 327 responsive to the test request command 345.

A method utilizes the test current Itest 350 as a delta stimulus to the signal conditioning unit (AF1) 327 or the module when the signal conditioning unit (AF1) 327 or the module is a linear system. A delta output from this linear system is proportional to the delta stimulus. If the actual delta output is not proportional to the delta stimulus when the test is conducted, the impacted integrity of the signal conditioning unit (AF1) 327 or the module is discovered.

The gain of the signal conditioning unit (AF1) 327 is 0.887 in an example (Vr=0.887 Vs). In this example, without test current, Vth_a1=5.556V=>Vs_a1=5.556/0.887=6.264V and Rb_a1=15000 ohms I=415 uA. With test resistor is engaged, Vth_t=3.63V=>Vs_t=3.63/0.887=4.092V I=562 uA. Delta Stimulus in voltage: Vs_a1−Vs_t=6.264−4.092=2.172V. Delta output in voltage: Vth_a1−Vth_t=5.556−3.63=1.926V. (Delta output in voltage)/(Delta stimulus in voltage)=1.926/2.172=0.887.

In this example, without a test current, the controller (U1) 342 discovers the signal Ground Fault output 341 status is changed from low to high when Vr reaches 5.556V. It used this reading as Vth_a1 (5.556V) to calculate the existing ground leak resistance $R_{b\_a}1$ as 15000 ohm, and calculate the overall resistance $R_{b\_t}$ to be 7160 ohms if test resistors (Rt1 and Rt2) are engaged. After the test resistors (Rt1 and Rt2) are engaged, and the controller (U1) 342 expects the signal Ground Fault output 341 status is changed from high to low when Vr reaches 3.63V. If the signal Ground Fault output status is changed from high to low when Vr reaches 3.63V, it indicates that the signal conditioning unit 327 is functional with a correct gain. If the signal Ground Fault output 341 status is changed before Vr reaches (3.63V+3%) or Vr is below (3.63V−3%), it indicates that the gain of the signal conditioning unit 327 is out of range.

Both Vs and Vr are voltages in this example, so the delta output from the signal conditioning unit 327 is a voltage, although the delta of output from the signal Ground Fault output 341 is still a voltage but it is treated as Boolean logic. To know a delta output from the signal conditioning unit 327 is proportional or not to a delta stimulus to the signal conditioning unit 327 the proportion scale is the gain of the signal conditioning unit 327, which is 0.887 in this example (Vr=0.887 Vs). In this example, without a test current, the controller (U1) 342 discovers the signal Ground Fault output 341 status is changed from low to high when Vr reaches 5.556V, then it enables the test current, and the controller (U1) 342 expects the signal Ground Fault output 341 status is changed from high to low when Vr reaches 3.63V. If the signal Ground Fault output 341 status is changed before Vr reaches (3.63V+3%) or Vr is below (3.63V−3%), indicating the gain of the signal conditioning unit 327 is not correct (Vr/=0.887 Vs) means the proportion scale is out of range. The signal conditioning unit 327 basically amplifies/filters the input signal Vs and outputs the signal Vr. The following comparator COMP1 340 determines the Vr is higher or lower than the threshold Vth set by the controller (U1) 342. In this example, when the test current is enabled, if proportional, the Vr is expected to be 3.63V, the output of COMP1 340 (Ground Fault output 341) is expected to be high when Vth is set to 3.64V and drop to low when Vth is set to 3.62V. If not proportional, the output of COMP1 340 (Ground Fault output 341) is either drops to low when Vth is set to 3.73V or above, or remains high when Vth is set to 3.52V and below.

In the ground fault tester (GFT) 300, the AC source (Vd) 307 comprises an oscillator (OSC) 352 coupled to an amplifier (AD1) 355 having an output 357. The output 357 of the amplifier (AD1) 355 coupled to a OSC signal health check circuit 360 to determine if the AC source (Vd) 307 produces a correct signal. The output of OSC signal health check circuit 360 is coupled to the controller 342 for checking integrity of the oscillator (OSC) 352.

In the ground fault tester (GFT) 300, the nodal supposition circuit 310 includes a first branch having a first capacitor (C1) 362(1) and a first resistor (Rt1) 365(1) in series and a second branch having a second capacitor (C2) 362(2) and a second resistor (Rt2) 365(2) in series. In application, the DC/battery powered equipment (DPE) 320 has a first terminal (BAT+) 367(1) wired to a center of the first branch in between the first capacitor (C1) 362(1) and the first resistor (Rt1) 365(1) and has a second terminal (BAT−) 367(2) wired to a center of the second branch in between the second capacitor (C2) 362(2) and the second resistor (Rt2) 365(2). In the ground fault tester (GFT) 300, the nodal supposition circuit 310 has a first connection 370(1) coupled to the resistor (Rd) 312 and a second connection 370(2) coupled to the relay device (K) 317.

In operation, the oscillator (OSC) 352 generates a low frequency sinusoidal AC signal reference to earth ground and feed into the amplifier (AD1) 355 to create a low impedance AC source (Vd) 307. The AC source (Vd) 307 is fed into the nodal supposition circuit 310 through the resistor (Rd) 312. The nodal supposition circuit 310 consists of two capacitors C1, C2 362(1-2) in series with two resistors Rt1, Rt2 365(1-2) in each branch and the DC/battery powered equipment (DPE) 320, which is the unit under the monitor, is connected to the center point of each branch. The capacitors C1, C2 362(1-2) couple the sinusoidal signal (Vd) to both the terminals of a battery and blocks the DC voltage of the battery. The common connection of two resistors Rt1, Rt2 365(1-2) is switched to the earth ground (GND) 315 through the relay device (K) 317 controlled by the controller (U1) 342. The signal (Vs) 330 is the raw signal for monitoring ground fault, sampled from the connection 370(1) between the resistor (Rd) 312 and the nodal supposition circuit 310. The signal (Vs) 330 is further filtered by the signal conditioning unit (AF1) 327, which provides signal conditioning, frequency filtering to remove out of band noise, amplitude adjustment and buffer. The output of the signal conditioning unit (AF1) 327 is the signal (Vr) 332. The signal (Vr) 332 is compared with an adjustable threshold 335 and the result is a binary signal indicating ground fault occurs or not.

When there is no ground fault at the system level, the external ground fault leakage current $I_{leak}$ is zero, the signal (Vs) 330 is full scale of the signal (Vd) 307. When there is ground fault leaks, equivalent a resistance from both of the battery terminals and the earth ground (GND) 315, the signal (Vs) 330 will decrease.

$$Vr = G_{AF1} * Vs$$

$$Vs = Vd - (Rd * (I_{leak} + I_{test}))$$

$$= V_d * |Z_b|/(Z_b + R_d)$$

where $G_{AF1}$ is transfunction gain of the signal conditioning unit (AF1) 327. Zb is overall leak path impedance (between the ground GND 315 and the connection node 370(1) which connects Rd 312 and the nodal supposition circuit 310).

By monitoring the signal (Vs) 330 in a monitoring mode, and comparing it to a preset threshold, the GFT 300 is able to detect the ground fault between the DPE 320 and the earth ground (GND) 315 if signal (Vr) 332 goes below the threshold configured by end users through controller (U1) 342. To verify the GFT 300 is functional and capable to monitoring ground fault, by command by an external device and switching to a test mode, the relay device (K) 317 contacts are switched to short, resistors Rt1 and Rt2 365(1-2) simulate a ground fault leak from the DPE 320 to the earth ground (GND) 315. If the ground fault is detected, the controller (U1) 342 or an external equipment, which commands the test, would verify the GFT 300 is in good health and functional. A periodical test is an important procedure for application to ensure the DC/battery powered equipment (DPE) 320 is indeed monitored under a functional ground fault detection device.

The ground fault tester (GFT) 300 is to verify the integrity of the signal conditioning unit (AF1) 327 or module as a truly functional AF1 module would reflect the actual ground leakage current and test leakage current and, hence, it will ensure that the ground fault tester (GFT) 300 is operating as intended. During a monitoring mode operation when no testing is commanded, the controller (U1) 342 periodically changes the output of the adjustable threshold module (TH) 305 until it: finds a trigger event if there is a existing system ground leakage through the DPE 320 or reaches the threshold setting $V_{th\_0}$ if there is no existing system ground leakage. The threshold value is recorded as $V_{th\_a}$. After this threshold is found, the GFT 300 is switched back to a nominal threshold setting to constantly monitor the ground fault.

Figure 4:
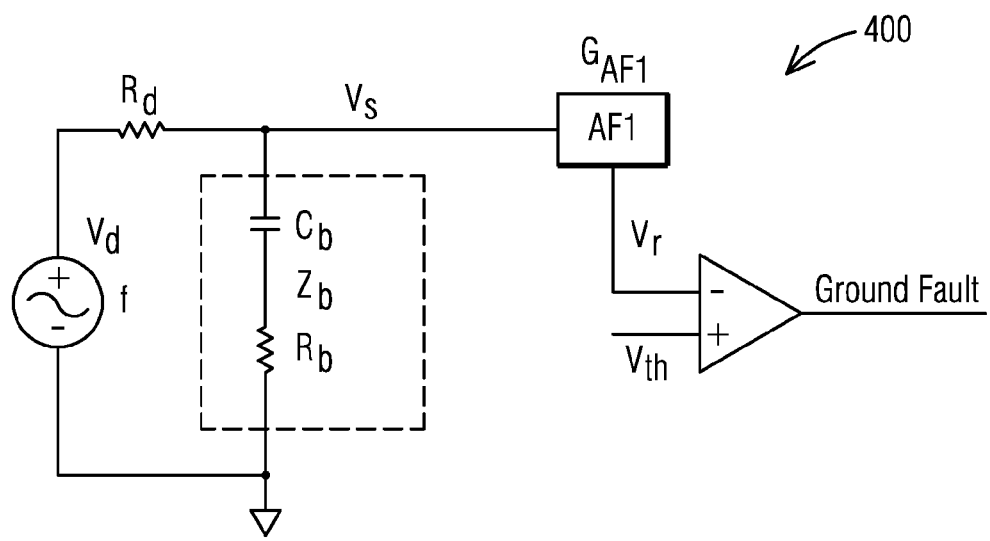
FIG. 4 illustrates a schematic circuit diagram of an equivalent circuit of a ground fault tester (GFT) in accordance with one exemplary embodiment of the present invention.

FIG. 4 illustrates a schematic circuit diagram of an equivalent circuit 400 of a ground fault tester (GFT) in accordance with one exemplary embodiment of the present invention. Assume combined current $I_{leak} + I_{test}$ has equivalent resistance Rb, and the overall impedance of $C_{1\&2} = C_b$ with $R_b$ is $Z_b$.

$$V_S = V_d - (R_d * (I_{leak} + I_{test})) = V_d * |Z_b/(Z_b + R_d)|$$

Where: $Z_b = R_b - j\dfrac{1}{2\pi f * C_b}$ $\pi = 3.14159, j^2 = -1$

=>

$R_b =$ $|[V_r * R_d / G_{AF1} - j*(V_r/G_{AF1} - V_d)/(2\pi f * C_b)]/(V_d - V_r/G_{AF1})| =$ $\left|\dfrac{V_r * R_d}{(GAF1 * Vd - Vr)} + j\dfrac{1}{(2\pi f * C_b)}\right| =$ $\sqrt{\left(\dfrac{Vr * Rd}{GAF1 * Vd - Vr}\right)^2 - \left(\dfrac{1}{2\pi f * Cb}\right)^2}$ This means if a GFT system knows the Vr reading then the GFT system can use above formula to calculate the equivalent resistance Rb present on a leakage branch.

While the GFT 300 is commanded to conduct the test, the controller (U1) 342 will first keep the test resistor Rt1 and Rt2 365(1-2) disengaged, the controller (U1) 342 will increase the output of the adjustable threshold module (TH) 305 from zero until it finds a ground fault trigger event. The controller U1 342 will record this threshold as $V_{th\_a}1$. Second, the controller (U1) 342 will engage the test resistors Rt1 and Rt2 365(1-2), and continue to decrease the output of the adjustable threshold module (TH) 305 until the trigger drops to no ground fault detected, and will record this threshold as $V_{th\_t}$. The following equation should be followed if there the signal conditioning unit (AF1) 327 is functional.

Vth_a = Vth_a1

$V_{th\_a1} = G_{AF1}*(Vd - Rd*I_{leak}) = V_d*|Z_{b\_a1}/(Z_{b\_a1} + R_d)|$

Where: $Z_{b\_a1} = R_{b\_a1} - j\dfrac{1}{2\pi f * C_b}$;

$C_b = C_1 + C_2 \Rightarrow R_{b\_a1} = \sqrt{\left(\dfrac{Vth\_a1 * Rd}{GAF1 * Vd - Vth\_a1}\right)^2 - \left(\dfrac{1}{2\pi f * Cb}\right)^2}$ $V_{th\_t} = G_{AF1} * V_d * |Z_{b\_t}/(Z_{b\_t} + R_d)|$ Where: $Zb\_t = Rb\_t - j\dfrac{1}{2\pi f * Cb}$; $Rb\_t = \dfrac{(Rb_{a1} * Rt)}{(Rb_{a1} + Rt)}$

=>

$V_{th\_t} =$ $|G_{AF1} * V_d * (R_{b\_t} - j*1/(2\pi f * C_b))/(R_{b\_t} - j*1/(2\pi f * C_b) + R_d)| =$ $\dfrac{GAF1 * Vd}{(Rb\_t + Rd)^2 + \left(\dfrac{1}{(2\pi f * Cb)}\right)^2} *$ $\left|\left(Rb\_t*(Rb\_t + Rd) + \left(\dfrac{1}{2\pi f * C1 \&2}\right)^2 - j\dfrac{Rd}{2\pi f * Cb}\right)\right| =$ $\dfrac{GAF1 * Vd}{(Rb\_t + Rd)^2 + \left(\dfrac{1}{(2\pi f * Cb)}\right)^2} *$ $\sqrt{\left(Rb\_t*(Rb\_t + Rd) + \left(\dfrac{1}{2\pi f * Cb}\right)^2\right)^2 + \left(\dfrac{Rd}{2\pi f * Cb}\right)^2}$ Where: $Rb\_t = \dfrac{(Rb\_a1 * Rt)}{(Rb\_a1 + Rt)}$ -continued $Rb\_a1 = \sqrt{\left(\dfrac{Vth\_a1 * Rd}{GAF1 * Vd - Vth\_a1}\right)^2 - \left(\dfrac{1}{2\pi f * Cb}\right)^2}$ The controller (U1) 342 will check the above third equation with tolerance, if the equation is not maintained, there is a failure that occurred inside the signal conditioning unit (AF1) 327 and the GFT 300 should be declared un-healthy.

The controller 342 checks whether an equation $V_{th\_t}=G_{AF1}*V_d*|Z_{b\_t}/(Z_{b\_t}+R_d)|$ is TRUE or NOT to determine whether a failure occurred inside the signal conditioning unit 327. The GAF1 is a gain of the signal conditioning unit 327. While the ground fault tester (GFT) 300 is commanded to conduct a test, the controller 342 first keeps the first and second resistors (Rt1) and (Rt2) 365(1-2) disengaged, the controller 342 increases the output of the adjustable threshold module (TH) 305 from zero until a ground fault trigger event is found and the controller 342 records this threshold as Vth_a1. Then the controller 342 engages the first and second resistors (Rt1) and (Rt2) 365(1-2), continues to decrease the output of the adjustable threshold module (TH) 305 until a trigger drops to a no ground fault detected status and records this threshold as Vth_t.

The equation $V_{th\_t}=G_{AF1}*V_d*|Z_{b\_t}/(Z_{b\_t}+R_d)|$ is followed when the signal conditioning unit 327 is functional. If the equation $V_{th\_t}=G_{AF1}*V_d*|Z_{b\_t}/(Z_{b\_t}+R_d)|$ is not maintained a failure occurred inside the signal conditioning unit 327 and the ground fault tester (GFT) 300 is declared un-healthy.

An example of the equivalent circuit 400's operation is described next.

f=10 Hz
$V_d$=12.5 Volts
Rd=15000 ohms
Rt=13700 ohms
$C_{1\&2}$=13.6 E-06 Farads (13.6 uF)
GAF1=0.887

When there is no leakage resistance present.

$V_{th\_0} = GAF1 * Vs = GAF1 * Vd = 0.887 * 12.5 = 11.0875$ V

If there is leak resistance Ri = 15000 ohms $V_{th\_a1} = GAF1 * Vs = GAF1 * (Vd - Rd * Ileak) =$ $GAF1 * (Vd - Rd * Vd/|((Ri - j(1/(2*pi*f*C1\&2)) + Rd)|) =$ $GAF1 * Vd * |(Ri - j(1/(2*pi*f*C1\&2))/$ $((Ri - j(1/(2*pi*f*C1\&2)) + Rd)| =$ $0.887 * 12.5 * 0.501 = 5.556$ During a self test period, the controller (U1) 342 would set Vth to zero, which represents a short circuit with highest leak current, and gradually increase Vth while monitoring the signal Ground Fault output, if there is no existing leakage current, the Vth would reach the maximum value, and the signal Ground Fault output 341 remains low. If there is leakage current that exists, at certain point, the signal Ground Fault output 341 will change to high. In this example, the Ground Fault output 341 changes to high when Vth reaches 5.556 Volt from zero volt, and this threshold is recorded as Vth_a1. Using the value of Vth_a1, the controller (U1) 342 reversely calculate the Ri value (Rb_a1) as following formula shows.

$$Rb\_a1 = \sqrt{\left(\frac{Vth\_a1 * Rd}{GAF1 * Vd - Vth\_a1}\right)^2 - \left(\frac{1}{2\pi f * C1\&2}\right)^2} = 15000$$

Where Vth_a1=5.556
Rd=15000
C1&2=13.6 E−06
GAF1=0.887

Based on this existing leakage resistance value Rb_a1, then the controller (U1) 342 would calculate the combined leakage resistance if Rt (resistors (Rt1) and (Rt2) 365(1-2)) is engaged:

$$Rb\_t = (Rb\_a1*Rt)/(Rb\_a1+Rt) = 15022*13700/(15022+13700) = 7160$$

Use following formula to calculate the $$Vth\_t = \frac{GAF1 * Vd}{(Rb\_t + Rd)^2 + \left(\frac{1}{(2\pi f * C1\&2)}\right)^2} *$$

$$\sqrt{\left(Rb\_t*(Rb\_t + Rd) + \left(\frac{1}{2\pi f * C1\&2}\right)^2\right)^2 + \left(\frac{Rd}{2\pi f * C1\&2}\right)^2} = 3.63$$

Where Rb_t=7160
Rd=15000
C1&2=13.6 E−06
GAF1=0.887

The signal Ground Fault output 341 remains high for now since the leakage current is higher. The GFT system would expect the Ground Fault output 341 remains high until the controller (U1) 342 decreases Vth to 3.63V. If the Ground Fault output 341 changes status from high to low either before or after this threshold of 3.63V (with some margin), it indicates the gain of AF1 327 is compromised.

Figure 5:
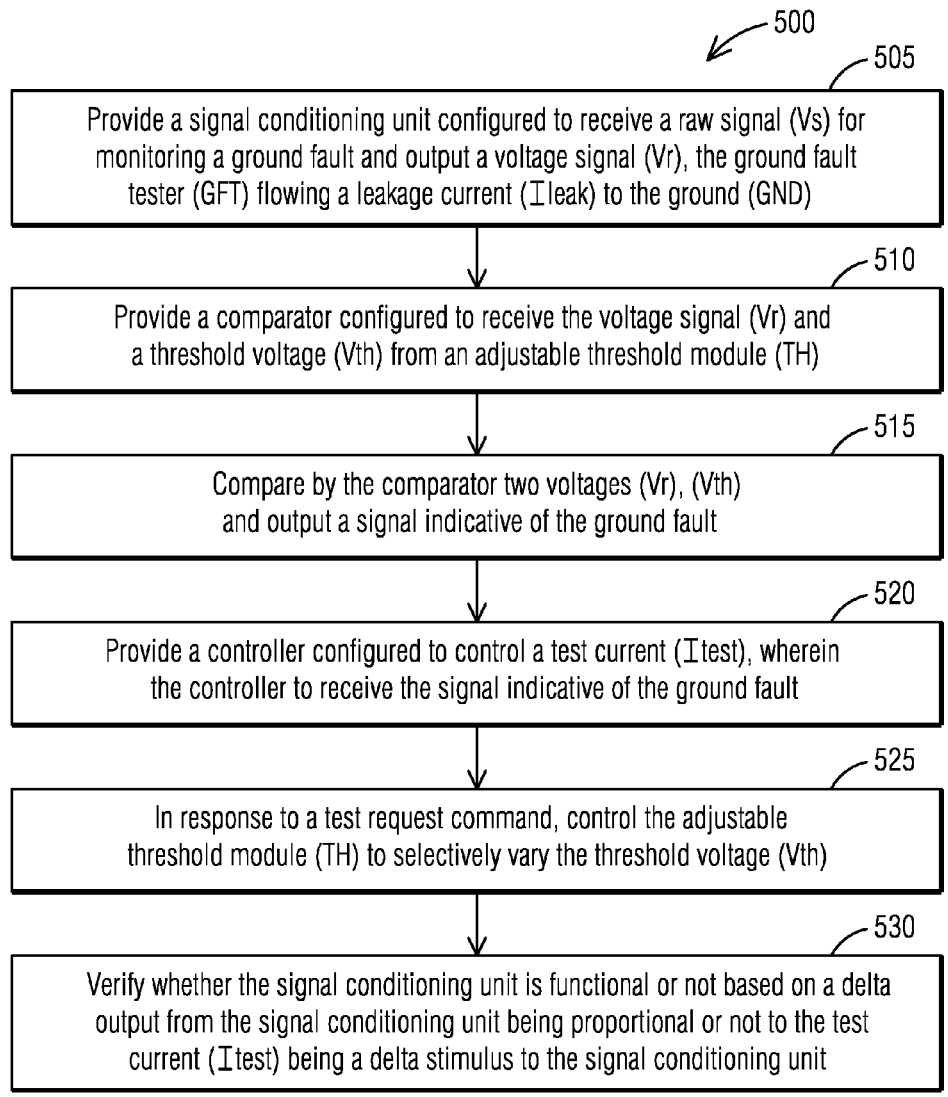
FIG. 5 illustrates a flow chart of a method of self-testing a ground fault tester (GFT) of an Event Analyzer and Recorder in response to a test command according to an exemplary embodiment of the present invention.

FIG. 5 illustrates a flow chart of a method 500 of self-testing the ground fault tester (GFT) 5 or 200 or 300 in response to a test command according to an exemplary embodiment of the present invention. Reference is made to the elements and features described in FIGS. 1-4. It should be appreciated that some steps are not required to be performed in any particular order, and that some steps are optional.

In step 505, the method 500 includes providing the signal conditioning unit 327 configured to receive the raw signal (Vs) 330 for monitoring a ground fault and output the voltage signal (Vr) 332. The ground fault tester (GFT) 300 includes the relay device (K) 317. The AC source (Vd) 307 is configured to feed into the nodal supposition circuit 310 through the resistor (Rd) 312. The nodal supposition circuit 312 is switched to the ground (GND) 315 through the relay device (K) 317. The DC/battery powered equipment (DPE) 320 is being monitored for ground fault and coupled to the nodal supposition circuit 310 and the virtual resistor (Ri) 322 represents a ground leak resistance for flowing the leakage current (Ileak) 325 to the ground (GND) 315.

In step 510, the method 500 includes providing the comparator 340 configured to receive the voltage signal (Vr) 332 and the threshold voltage (Vth) 335 from the adjustable threshold module (TH) 305. In step 515, the method 500 includes comparing by the comparator 340 two voltages (Vr), (Vth) and outputting the signal 341 indicative of the ground fault. In step 520, the method 500 includes providing the controller 342 configured to control the test current (Itest) 350. The controller 342 receives the signal 341 indicative of the ground fault.

In step 525, the method 500 includes, in response to the test request command 345, controlling the adjustable threshold module (TH) 305 to selectively vary the threshold voltage (Vth) 335. In step 530, the method 500 includes verifying whether the signal conditioning unit 327 is functional or not based on a delta output from the signal conditioning unit 327 being proportional or not to a delta stimulus to the signal conditioning unit 327 by introducing the test current (Itest) 350.

The method 500 further includes while the ground fault tester (GFT) 300 is commanded to conduct a test, first keeping by the controller 342 test resistors (Rt1) and (Rt2) 365(1-2) disengaged. Then increasing by the controller 342 an output of the adjustable threshold module (TH) 305 from zero until a ground fault trigger event is found. The controller 342 records this threshold as Vth_a1. Then the controller 342 engages the test resistors (Rt1) and (Rt2) 365(1-2) and continues to decrease the output of the adjustable threshold module (TH) 305 until a trigger drops to a no ground fault detected status. The controller 342 records this threshold as Vth_t. The method 500 further includes checking by the controller 342 whether an equation Vth_t=GAF1*Vd*|Zb_t/(Zb_t+Rd)| is TRUE or NOT to determine whether a failure occurred inside the signal conditioning unit 327. The term GAF1 is a gain of the signal conditioning unit 327.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A ground fault tester (GFT) for use with an Event Analyzer and Recorder, the ground fault tester (GFT) comprising:
    an AC source (Vd) configured to feed into a nodal supposition circuit through a resistor (Rd), the nodal supposition circuit switched to a ground (GND) through a relay device (K), wherein a DC/battery powered equipment (DPE) is being monitored for a ground fault by the ground fault tester (GFT) and is coupled to the nodal supposition circuit and a virtual resistor (Ri) that represents a ground leak resistance for flowing a leakage current (Ileak) to the ground (GND);
    a signal conditioning unit having a linear gain coupled to the resistor (Rd) and the nodal supposition circuit to receive a raw signal (Vs) for monitoring a ground fault and output a voltage signal (Vr);
    an adjustable threshold module (TH) to provide a threshold voltage (Vth);
    a comparator to receive the voltage signal (Vr) and the threshold voltage (Vth) to compare two voltages (Vr), (Vth) and output a signal indicative of the ground fault; and
    a controller to receive a test request command and output a GFT output, the controller to control the relay device (K) for flowing a test current (Itest) to the ground (GND) from the nodal supposition circuit,
    wherein the controller to receive the signal indicative of the ground fault and control the adjustable threshold module (TH) to selectively vary the threshold voltage (Vth) in order to verify whether the signal conditioning unit is functional or not based on a disappearance of an alarm signal when a delta output from the signal conditioning unit is proportional or not to a delta stimulus, introduced by engaging a known test resistance (Rt1) and (Rt2) in parallel with an existing ground leak resistance, to the signal conditioning unit responsive to the test request command.

2. The ground fault tester (GFT) of claim 1, wherein the AC source (Vd) comprises an oscillator coupled to an amplifier having an output, the output of the amplifier coupled to a OSC signal health check circuit to determine if the AC source (Vd) produces a correct signal, the output of OSC signal health check circuit is coupled to the controller for checking integrity of the oscillator.

3. The ground fault tester (GFT) of claim 1, wherein the signal conditioning unit is a combination of a linear amplifier to provide a linear gain and a frequency filter to remove out of band noise.

4. The ground fault tester (GFT) of claim 1, wherein the nodal supposition circuit includes a first branch having a first capacitor (C1) and a first resistor (Rt1) in series and a second branch having a second capacitor (C2) and a second resistor (Rt2) in series.

5. The ground fault tester (GFT) of claim 4, wherein the DC/battery powered equipment (DPE) having a first terminal (BAT+) coupled to a center of the first branch in between the first capacitor (C1) and the first resistor (Rt1) and having a second terminal (BAT−) coupled to a center of the second branch in between the second capacitor (C2) and the second resistor (Rt2).

6. The ground fault tester (GFT) of claim 4, wherein the nodal supposition circuit having a first connection coupled to the resistor (Rd) and a second connection coupled to the relay device (K).

7. The ground fault tester (GFT) of claim 4, wherein the controller checks whether an equation $Vth\_t=|GAF1*Vd*(Rb\_t-j*1/(2\pi f*Cb))/(Rb\_t-j*1/(2\pi f*Cb)+Rd)|$ is TRUE or NOT to determine whether a failure occurred inside the signal conditioning unit, wherein GAF1 is a gain of the signal conditioning unit.

8. The ground fault tester (GFT) of claim 7, wherein the equation $Vth\_t=|GAF1*Vd*(Rb\_t-j*1/(2\pi f*Cb))/(Rb\_t-j*1/(2\pi f*Cb)+Rd)|$ is followed when the signal conditioning unit is functional.

9. The ground fault tester (GFT) of claim 7, wherein if the equation $Vth\_t=|GAF1*Vd*(Rb\_t-j*1/(2\pi f*Cb))/(Rb\_t-j*1/(2\pi f*Cb)+Rd)|$ is not maintained a failure occurred inside the signal conditioning unit and the ground fault tester (GFT) is declared un-healthy.

10. The ground fault tester (GFT) of claim 7, wherein a recorded threshold value $Vth\_a$ is converted into equivalent leakage resistance and provided as a parameter to an end customer for estimating an existing ground fault leakage, wherein during a normal operating condition with no testing commanded, the controller is configured to periodically change an output of the adjustable threshold module (TH) until a trigger event is found if there is a existing system ground leakage through the DC/battery powered equipment (DPE) or reach a threshold setting $Vth\_0$ if there is no existing system ground leakage, the controller records this threshold value as the recorded threshold value $Vth\_a$.

11. The ground fault tester (GFT) of claim 10, wherein if the $Vth\_a$ is approaching a trigger point, the $Vth\_a$ serves as a warning alarm signal to an end user to diagnose a ground fault leakage before an actual ground fault reaches the trigger point.

12. A method of self-testing a ground fault tester (GFT), the method comprising:

providing a signal conditioning unit configured to receive a raw signal (Vs) for monitoring a ground fault and output a voltage signal (Vr), the ground fault tester (GFT) including a relay device (K), wherein an AC source (Vd) is configured to feed into the nodal supposition circuit through a resistor (Rd), the nodal supposition circuit switched to a ground (GND) through the relay device (K), wherein a DC/battery powered equipment (DPE) is being monitored for a ground fault by the ground fault tester (GFT) and is coupled to the nodal supposition circuit and a virtual resistor (Ri) that represents a ground leak resistance for flowing a leakage current (Ileak) to the ground (GND);

providing a comparator configured to receive the voltage signal (Vr) and a threshold voltage (Vth) from an adjustable threshold module (TH);

comparing by the comparator two voltages (Vr), (Vth) and outputting a signal indicative of the ground fault;

providing a controller configured to control a test current (Itest), wherein the controller to receive the signal indicative of the ground fault;

in response to a test request command, controlling the adjustable threshold module (TH) to selectively vary the threshold voltage (Vth); and verifying whether the signal conditioning unit is functional or not based on a delta output from the signal conditioning unit being proportional or not to a delta stimulus, introduced by engaging a known test resistance (Rt1) and (Rt2) in parallel with an existing ground leak resistance, to the signal conditioning unit.

13. The method of claim 12, further including:

while the ground fault tester (GFT) is commanded to conduct a test, first keeping by the controller test resistors (Rt1) and (Rt2) disengaged;

changing by the controller an output of the adjustable threshold module (TH) until a trigger event is found, the controller records this threshold as $Vth\_a1$; then the controller engaging the test resistors (Rt1) and (Rt2), and continues to change the output of the adjustable threshold module (TH) until a trigger drops to a no ground fault detected status, and records this threshold as $Vth\_t$; and checking by the controller whether an equation $Vth\_t=|GAF1*Vd*(Rb\_t-j*1/(2\pi f*Cb))/(Rb\_t-j*1/(2\pi f*Cb)+Rd)|$ is TRUE or NOT to determine whether a failure occurred inside the signal conditioning unit, wherein GAF1 is a gain of the signal conditioning unit.

\* \* \* \* \*